United States Patent
Yuasa (10) Patent No.: US 12,362,133 B2
(45) Date of Patent: Jul. 15, 2025

(54) TRANSPORT DEVICE AND CHARGED PARTICLE BEAM SYSTEM

(71) Applicant: JEOL Ltd., Tokyo (JP)

(72) Inventor: Shuichi Yuasa, Tokyo (JP)

(73) Assignee: JEOL Ltd., Tokyo (JP)

( * ) Notice: Subject to any disclaimer, the term of this patent is extended or adjusted under 35 U.S.C. 154(b) by 558 days.

(21) Appl. No.: 17/570,775

(22) Filed: Jan. 7, 2022

(65) Prior Publication Data

US 2022/0223369 A1    Jul. 14, 2022

(30) Foreign Application Priority Data

Jan. 8, 2021    (JP) .................................. 2021-002166

(51) Int. Cl.
*H01J 37/20*    (2006.01)
*H01J 37/18*    (2006.01)

(52) U.S. Cl.
CPC ......... *H01J 37/20* (2013.01); *H01J 2237/204* (2013.01)

(58) Field of Classification Search
CPC .......... H01J 37/00; H01J 37/20; H01J 37/185; H01J 2237/204
See application file for complete search history.

(56) References Cited

U.S. PATENT DOCUMENTS

| | | |
|---|---|---|
| 3,488,493 A | 1/1970 | Mills |
| 4,587,431 A | 5/1986 | Uemura |
| 4,705,950 A | 11/1987 | Ohtaka |
| 4,710,633 A | 12/1987 | Suzuki |
| 6,469,309 B1 | 10/2002 | Kasai |
| 6,818,560 B1 | 11/2004 | Koshimizu et al. |
| 2006/0022135 A1 | 2/2006 | Moore et al. |
| 2015/0076344 A1 | 3/2015 | Heyoung |
| 2015/0076345 A1* | 3/2015 | Heyoung ................ H01J 37/20 250/311 |
| 2015/0137000 A1 | 5/2015 | Naruse |
| 2017/0133197 A1 | 5/2017 | Kawai |
| 2020/0051775 A1* | 2/2020 | Yoshida ................ H01J 37/185 |

(Continued)

FOREIGN PATENT DOCUMENTS

| | | | |
|---|---|---|---|
| CN | 203062587 U | * | 7/2013 |
| CN | 110299275 A | * | 10/2019 |
| EP | 3038131 A1 | | 6/2016 |

(Continued)

OTHER PUBLICATIONS

English translation of JP-H11185686 from Espacenet <br> (Year: 1999).*

(Continued)

*Primary Examiner* — David E Smith
*Assistant Examiner* — Laura Eloise Tandy
(74) *Attorney, Agent, or Firm* — The Webb Law Firm (57) ABSTRACT

There is provided a transport device capable of reducing drifting of a sample. The transport device delivers a cartridge to a sample holder in a charged particle beam system. The transport device has a mounting portion to which the cartridge can be detachably mounted, a shaft portion providing support of the mounting portion, a resilient member connecting together the shaft portion and the mounting portion, and a drive mechanism for moving the mounting portion.

5 Claims, 6 Drawing Sheets

(56) References Cited

U.S. PATENT DOCUMENTS

2021/0313142 A1* 10/2021 Chiyo .................. H01J 37/265
2022/0013325 A1    1/2022 Chen

FOREIGN PATENT DOCUMENTS

| | | | |
|---|---|---|---|
| JP | H0817381 A | | 1/1996 |
| JP | H11185686 A | * | 7/1999 |
| JP | 2000268758 A | | 9/2000 |
| JP | 2002365182 A | | 12/2002 |
| JP | 201588237 A | | 5/2015 |
| KR | 1020010039900 A | | 5/2001 |

OTHER PUBLICATIONS

English translation of JP-H11185686 from Espacenet (Year: 1999).*
English translation of CN-110299275 from Espacenet (Year: 2019).*
English translation of CN-203062587 from Espacenet (Year: 2013).*
English translation of Zhang, et. al. (Year: 2019).*
English Translation of Hideo (Year: 1999).*
Extended European Search Report issued in EP21217690.3 on May 30, 2022.
1 Notice of Allowance And Fee(s) Due issued in U.S. Appl. No. 17/570,749 on Feb. 2, 2023.
Office Action issued in JP2021002167 on Dec. 20, 2022.
Office Action issued in JP2021002165 on Dec. 20, 2022.
Office Action issued in U.S. Appl. No. 17/570,802 on Mar. 7, 2024.

* cited by examiner

TRANSPORT DEVICE AND CHARGED PARTICLE BEAM SYSTEM

CROSS-REFERENCE TO RELATED APPLICATION

This application claims priority to Japanese Patent Application No. 2021-002166, filed Jan. 8, 2021, the disclosure of which is hereby incorporated by reference in its entirety.

BACKGROUND OF THE INVENTION

1. Field of the Invention

The present invention relates to a transport device and a charged particle beam system.

2. Description of the Related Art

In the field of charged particle beam systems including transmission electron microscopes, it is known to use a transport device for conveying a cartridge, which holds a sample therein, into a sample chamber.

For example, JP-A-2015-88237 discloses a charged particle beam system equipped with a transport rod for carrying a cartridge between a sample exchange chamber and a sample chamber. The transport rod carries the cartridge into the sample holding portion of a sample holder disposed in the sample chamber.

When the cartridge is transferred to the sample holder using the transport rod, a force is applied to the sample holder. This may deform the sample holder, producing drift of the sample.

SUMMARY OF THE INVENTION

One aspect of the transport device associated with the present invention operates to deliver a cartridge to a sample holder in a charged particle beam system. The transport device includes: a mounting portion to which the cartridge can be detachably mounted; a shaft portion providing support of the mounting portion; a resilient member connecting together the shaft portion and the mounting portion; and a drive mechanism for moving the mounting portion.

With this transport device, when the cartridge is delivered to the sample holder, the resilient member deforms resiliently and so the force applied to the sample holder can be reduced. Consequently, drifting of the sample can be reduced.

One aspect of the charged particle beam system associated with the present invention includes the sample holder described just above.

DESCRIPTION OF THE INVENTION

The preferred embodiments of the present invention are hereinafter described in detail with reference to the accompanying drawings. It is to be understood that the embodiments provided below are not intended to unduly restrict the contents of the present invention delineated by the claims and that not all the configurations set forth below are the essential constituent components of the invention.

In the following, an electron microscope using an electron beam is set forth as one example of a charged particle beam system associated with the present invention. The charged particle beam system associated with the present invention may also be an instrument using a charged particle beam other than an electron beam such as an ion beam.

1. Electron Microscope

1.1. Configuration of Electron Microscope

Figure 1:
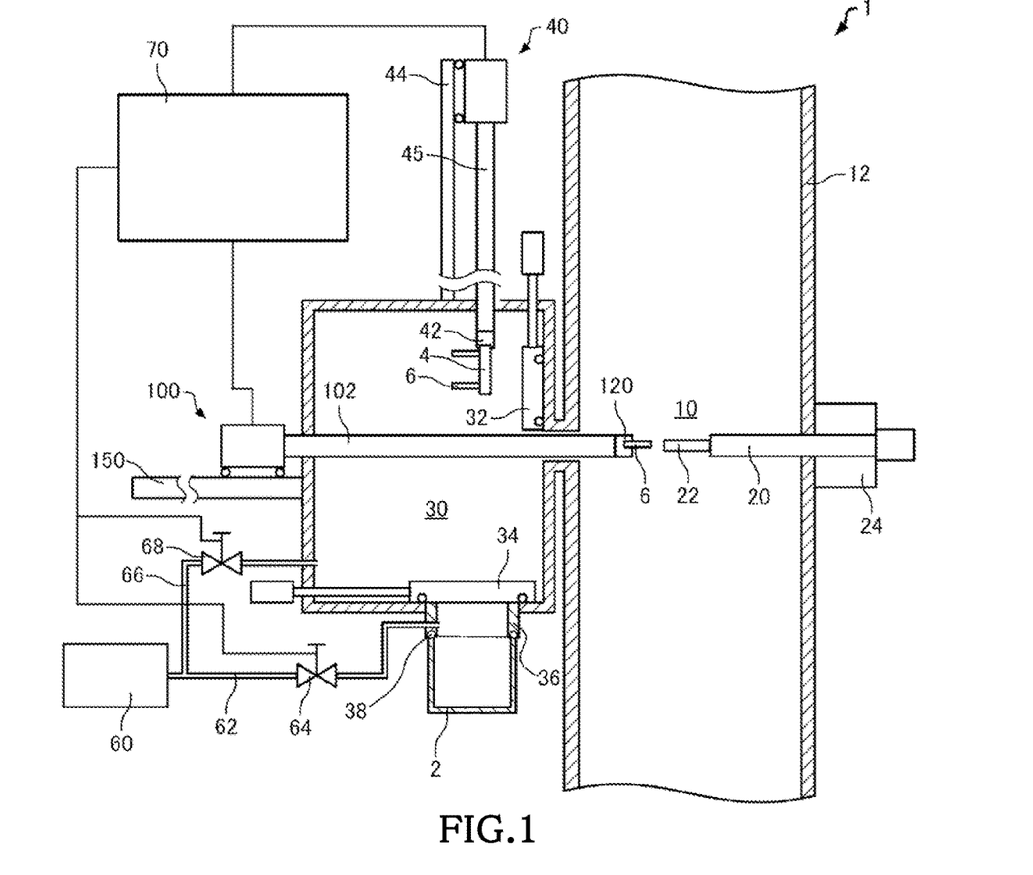
FIGS. 1 and 2 are diagrams, partially in block form, showing the configuration of an electron microscope including a transport device associated with one embodiment of the present invention.

An electron microscope including a transport device (hereinafter referred to as the second transport device 100) associated with one embodiment of the present invention is first described by referring to FIGS. 1 and 2, which show the configuration of the electron microscope, 1, which includes the second transport device 100. FIG. 1 is a cross-sectional view taken on line I-I of FIG. 2.

As shown in FIG. 1, the electron microscope 1 includes a sample container 2, a sample chamber 10, a sample holder 20, a sample exchange chamber 30, a first transport device 40, vacuum pumping equipment 60, and a controller 70, as well as the second transport device 100. The electron microscope 1 is a transmission electron microscope, for example.

The sample chamber 10 is formed in an electron optical column 12. An electron source for emitting an electron beam, an illumination optical system, and an imaging system (none of which are shown) are housed in the electron optical column 12. The electron beam emitted from the electron source is directed at a sample by the illumination optical system. The imaging system creates a focused TEM image from the electron beam transmitted through the sample. The electron microscope 1 is also equipped with a detector for detecting the image focused by the imaging system and a detector for detecting X-rays released from the sample in a manner not illustrated.

The sample chamber 10 includes the space between top and bottom polepieces of an objective lens (not shown). The sample chamber 10 is evacuated to a vacuum by vacuum pumping equipment. The sample holder 20 has a mounting portion 22 which is disposed in the sample chamber 10. A cartridge 6 is mounted to the mounting portion 22.

The sample holder 20 is placed in position by a goniometer stage 24 capable of tilting a sample held on the sample holder 20. In the electron microscope 1, the sample can be tilted relative to two mutually perpendicular axes, for example.

The sample holder 20 has the mounting portion 22 to which the cartridge 6 is mounted as mentioned previously. The sample is held in the cartridge 6. Because the cartridge 6 is mounted to the mounting portion 22, the sample can be observed in the electron microscope 1.

The sample exchange chamber 30 is coupled to the sample chamber 10. A partition valve 32 is mounted between the sample exchange chamber 30 and the sample chamber 10.

The sample container 2 is connected into the sample exchange chamber 30 via a connective member 36 in the illustrated example. The sample container 2 can be mounted to and detached from the connective member 36. Another partition valve 34 is mounted between the sample exchange chamber 30 and the sample container 2. The sample exchange chamber 30 and the sample container 2 are evacuated to a vacuum by the vacuum pumping equipment 60.

When the sample container 2 is connected to the connective member 36, a vacuum seal 38 is placed between the connective member 36 and the sample container 2. The vacuum seal 38 is an O-ring, for example. When the sample container 2 is coupled into the sample exchange chamber 30, the vacuum seal 38 makes it possible to make the interiors of the sample exchange chamber 30 and sample container 2 airtight.

The sample container 2 is used to receive a sample. In the illustrated example, a magazine 4 is received in the sample container 2. A plurality of cartridges 6 can be loaded in the magazine 4. A case is now presented in which the magazine 4 having the cartridges 6 loaded therein is received in the sample container 2. Alternatively, the cartridges 6 may be directly received into the sample container 2.

The first transport device 40 transports the magazine 4 between the sample container 2 and the sample exchange chamber 30. The first transport device 40 has a chuck device 42 and a drive mechanism 44 for moving the chuck device 42 in an up/down direction. The chuck device 42 grips the magazine 4. The drive mechanism 44 moves the chuck device 42 by moving a shaft portion 45 having a front end to which the chuck device 42 is mounted, using power from an electric motor or an air cylinder.

The second transport device 100 transports each cartridge 6 between the sample exchange chamber 30 and the sample chamber 10. The second transport device 100 delivers the cartridge 6 to the sample holder 20.

The second transport device 100 takes out one cartridge 6 from the magazine 4 gripped by the first transport device 40. The second transport device 100 carries the extracted cartridge 6 from the sample exchange chamber 30 to the sample chamber 10 and mounts the cartridge 6 to the mounting portion 22 of the sample holder 20.

The second transport device 100 has a shaft portion 102, a chuck device 120, and a drive mechanism 150 for moving the chuck device 120. The drive mechanism 150 moves the chuck device 120 horizontally by moving the shaft portion 102 having a front end to which the chuck device 120 is mounted, using power from an electric motor or an air cylinder.

Figure 2:
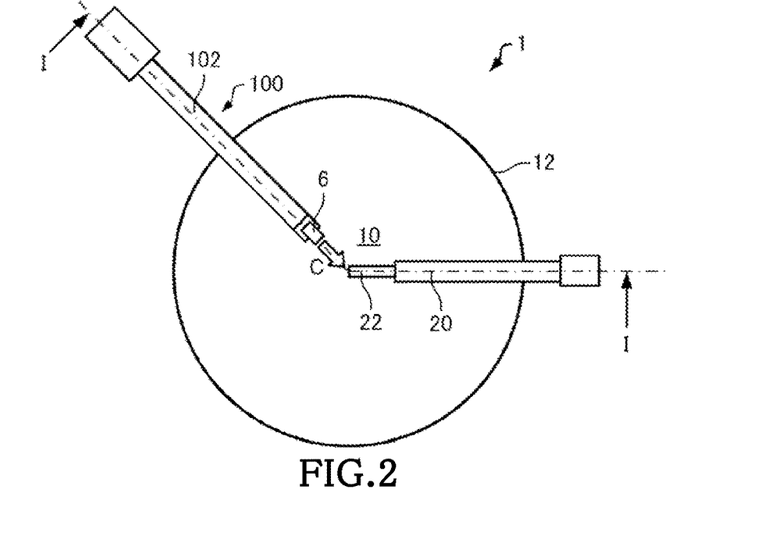

As shown in FIG. 2, the second transport device 100 mounts the cartridge 6 to the mounting portion 22 of the sample holder 20 by moving the cartridge 6 in an oblique direction C relative to the central axis of the sample holder 20.

The vacuum pumping equipment 60 evacuates the sample container 2 to a vacuum via an exhaust tube 62. A solenoid valve 64 is mounted in the exhaust tube 62. The vacuum pumping equipment 60 also evacuates the sample exchange chamber 30 to a vacuum via an exhaust tube 66. A solenoid valve 68 is mounted in the exhaust tube 66. The sample exchange chamber 30 is maintained in a vacuum by evacuating the chamber by means of the vacuum pumping equipment 60.

The controller 70 controls the partition valves 32, 34, first transport device 40, second transport device 100, and solenoid valves 64, 68. For example, the controller 70 includes a CPU (central processing unit) and storage devices such as a RAM (random access memory) and a ROM (read only memory). The controller 70 performs various kinds of control operations by executing programs stored in the storage devices with the CPU.

1.2. Second Transport Device

Figure 3:
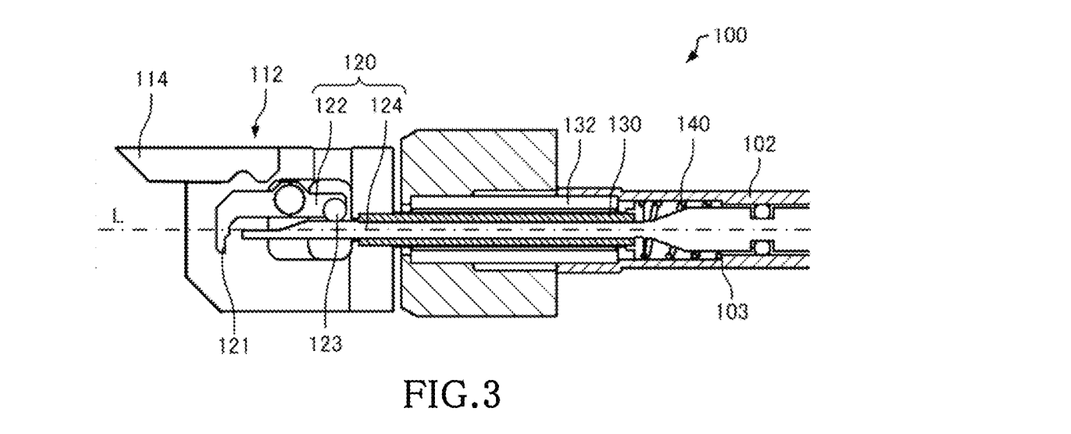
FIGS. 3 and 4 are schematic plan views, partly in cross section, of the transport device of FIGS. 1 and 2, showing different states.
Figure 4:
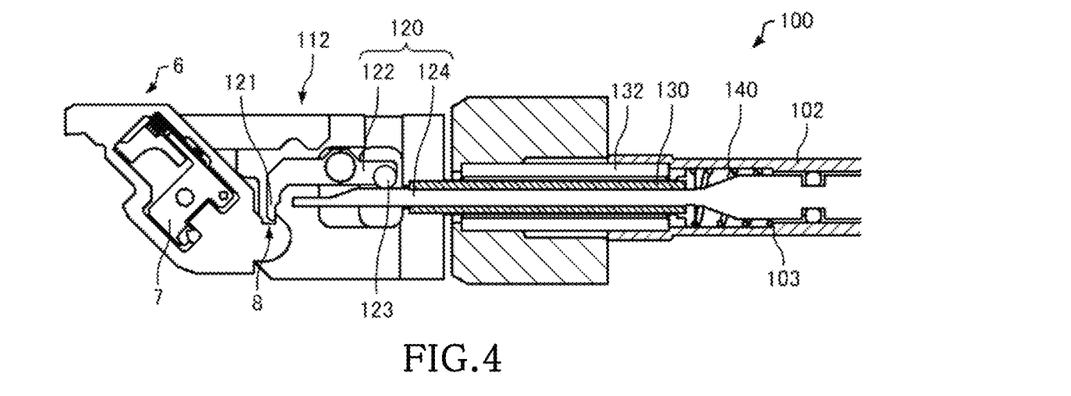

FIGS. 3 and 4 are schematic plan views of the second transport device 100 associated with one embodiment of the present invention. FIG. 4 shows a state in which the second transport device 100 grips the cartridge 6, i.e., the cartridge 6 is mounted to the mounting portion 112.

As shown in FIGS. 3 and 4, the second transport device 100 includes the shaft portion 102, the mounting portion 112, the chuck device 120, a shaft member 130, a bearing 132, and a resilient member 140. The shaft portion 102 is a rodlike member and supports the mounting portion 112. The mounting portion 112 can be moved by moving the shaft portion 102 with the drive mechanism 150.

The mounting portion 112 is formed at the front end of the shaft portion 102 and secured to the shaft member 130. The cartridge 6 can be mounted to the mounting portion 112 which has a cartridge placement surface 114 on which the cartridge 6 is to be placed.

The chuck device 120 is mounted to the mounting portion 112 and can secure the cartridge 6 to the mounting portion 112. The chuck device 120 includes a lever 122 and a manipulative shaft 124. The lever 122 is mounted to the mounting portion 112 and has a hooked front end portion 121. This front end portion 121 engages a cutout 8 formed in the cartridge 6, thus securing the cartridge 6. The lever 122 has a rear end portion 123 in contact with the manipulative shaft 124. In the illustrated example, the rear end portion 123 is a ball in contact with the shaft 124. The lever 122 is biased by a spring (not shown) to press the rear end portion 123 against the manipulative shaft 124. In the illustrated example, the lever 122 is biased by the spring so as to rotate clockwise.

The manipulative shaft 124 is a mechanical member for manipulating the lever 122. The manipulative shaft 124 has a front end in contact with the lever 122 and movably passes through the shaft member 130 and through the shaft portion 102. The shaft 124 has a central axis that is parallel, for example, to the central axis L of the shaft portion 102. The manipulative shaft 124 is connected to a drive source (not shown) such as an air cylinder. Power from the drive source moves the manipulative shaft 124 along the central axis L of the shaft portion 102, whereby the cartridge 6 can be switched between an unlocked state and a locked state. Details of the operation of the chuck device 120 will be described later.

The resilient member 140 connects together the shaft portion 102 and the mounting portion 112. One end of the resilient member 140 is secured to the shaft member 130, while the other end is fixed to the shaft portion 102.

In the illustrated example, the shaft portion 102 is provided with a space to receive the resilient member 140 and the manipulative shaft 124. The space has a larger diameter portion and a smaller diameter portion. The resilient member 140 is received in the larger diameter portion. A protrusive portion 103 is formed at the boundary between the larger and smaller diameter portions and retains the resilient member 140, which in turn is sandwiched between the shaft member 130 and the protrusive portion 103.

The resilient member 140 is a compression spring, for example. Since the resilient member 140 becomes compressed, it relaxes the compressive force. The resilient member 140 elastically deforms along the central axis L. In the second transport device 100, the force applied to the sample holder 20 can be reduced by elastic deformation of the resilient member 140 when the cartridge 6 is delivered to the sample holder 20.

The resilient member 140 is not restricted to a spring as long as the force applied to the shaft portion 102 can be reduced by elastic deformation of the resilient member 140. It may also be a resilient body other than a spring.

The mounting portion 112 is connected to the front end of the shaft member 130. The resilient member 140 is secured to the rear end of the shaft member 130. In this way, the mounting portion 112 is connected to the shaft portion 102 via the shaft member 130 and the resilient member 140. The shaft member 130 is cylindrical in form, for example, through which the manipulative shaft 124 passes.

The bearing 132 guides rectilinear motion of the shaft member 130. The bearing 132 and the shaft member 130 together constitute a ball spline, for example. That is, the shaft member 130 is the splined shaft of the ball spline, while the bearing 132 is the outer shell of the ball spline. For example, grooves (splines) are formed in the outer surface of the shaft member 130 along the central axis. Balls (not shown) are retained by a retainer incorporated in the bearing 132 and run in the grooves, thus permitting rectilinear motion of the shaft member 130 while suppressing rotation of the shaft member 130.

The cartridge 6 holds a sample and has a sample stage 7 on which the sample is held. The sample stage 7 is provided with a through hole over which the sample is held. The sample is held on the sample stage 7, for example, using a C-ring or a leaf spring. The sample stage 7 may be tiltable. The cartridge 6 has the cutout 8 that engages the front end portion 121 of the chuck device 120 as described above.

2. Operation

2.1. Operation of Transport Device

Figure 5:
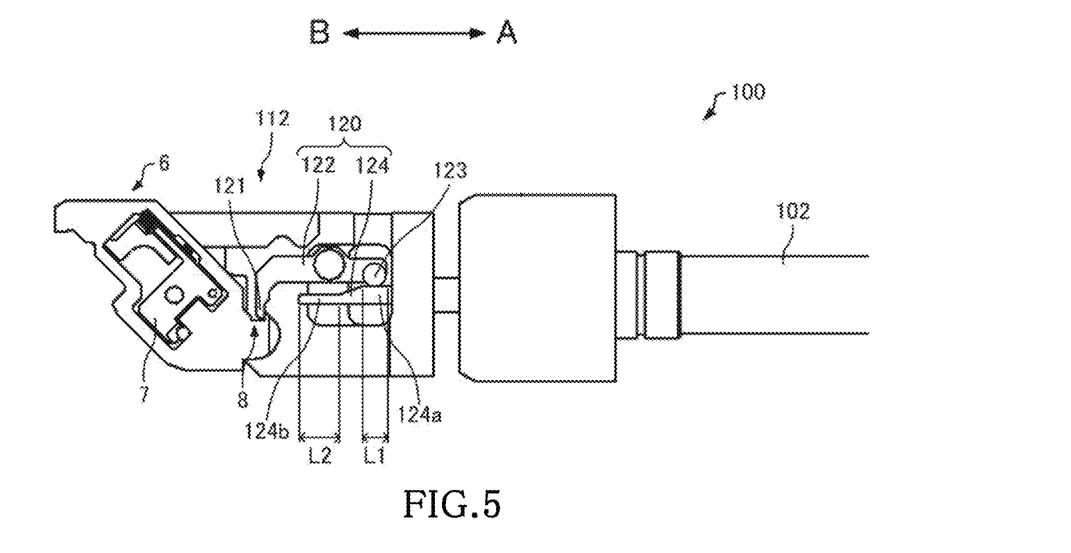
FIGS. 5 and 6 are partial cutaway views, illustrating different operational states of the transport device of FIGS. 1 and 2.
Figure 6:
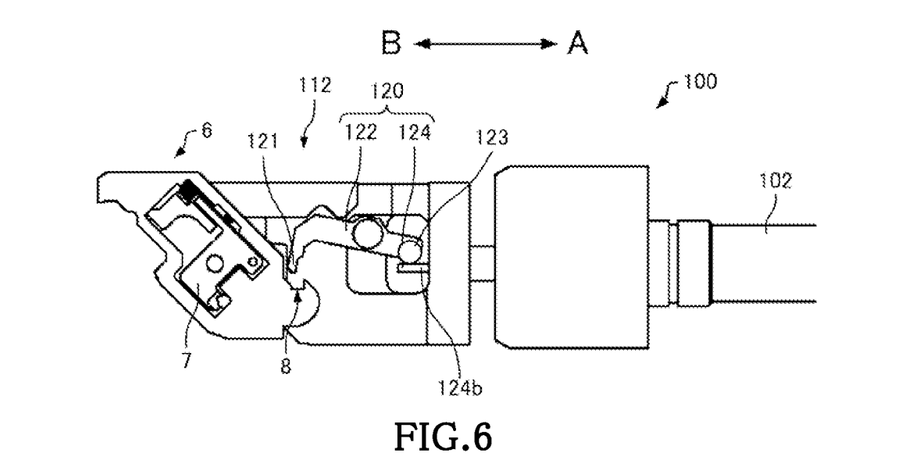

FIGS. 5 and 6 illustrate the operation of the second transport device 100. FIG. 5 shows a state in which the chuck device 120 locks the cartridge 6 to the mounting portion 112. FIG. 6 shows a state in which the chuck device 120 unlocks the cartridge 6.

The manipulative shaft 124 has a first portion 124a and a second portion 124b. The second portion 124b is a cutout of the shaft 124. The first portion 124a has no cutout. In the illustrated example, the second portion 124b is located closer to the front end of the manipulative shaft 124 than the first portion 124a.

The position at which the rear end portion 123 of the lever 122 contacts the manipulative shaft 124 is varied by moving the shaft 124 along the central axis L of the shaft portion 102. As a result, the lever 122 can be actuated.

When the lever 122 is in contact with the first portion 124a as shown in FIG. 5, the chuck device 120 holds and clamps the cartridge 6. In particular, the front end portion 121 of the lever 122 engages the cutout 8 of the cartridge 6, so that the cartridge 6 is secured to the mounting portion 112.

When the lever 122 is in contact with the second portion 124b as shown in FIG. 6, the chuck device 120 unlocks the cartridge 6. In particular, the front end portion 121 of the lever 122 disengages from the cutout 8 of the cartridge 6, whereby the cartridge 6 is unlocked.

If the manipulative shaft 124 is moved in a first direction A from the state where the rear end portion 123 of the lever 122 is in contact with the first portion 124a of the shaft 124 as shown in FIG. 5, the rear end portion 123 of the lever 122 makes contact with the second portion 124b. This rotates the lever 122 clockwise and thus the lever 122 disengages from the cutout 8 as shown in FIG. 6. As a result, the cartridge 6 is unlocked.

Furthermore, if the manipulative shaft 124 is moved in a second direction B from the state where the rear end portion 123 of the lever 122 is in contact with the second portion 124b of the manipulative shaft 124 as shown in FIG. 6, the rear end portion 123 of the lever 122 makes contact with the first portion 124a. This rotates the lever 122 counterclockwise, so that the front end portion 121 of the lever 122 engages the cutout 8 as shown in FIG. 5. As a result, the cartridge 6 is secured to the mounting portion 112.

Figure 7:
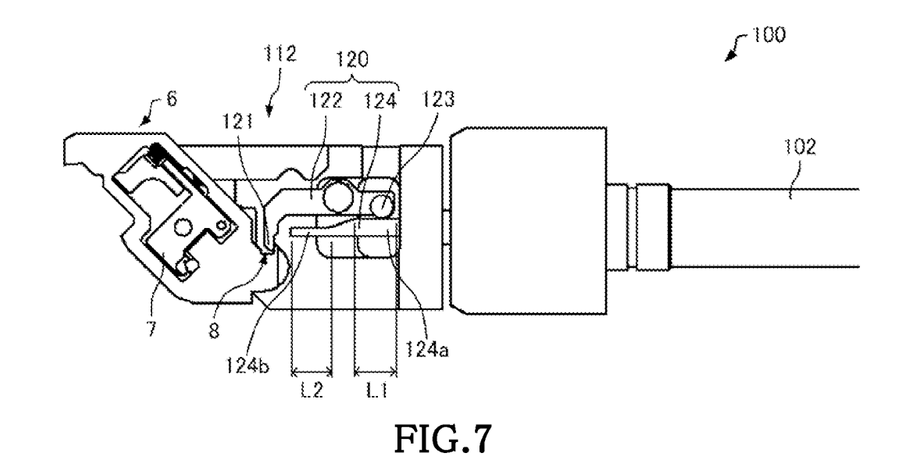
FIGS. 7 and 8 are partial cutaway views, illustrating the functions of a resilient member.
Figure 8:
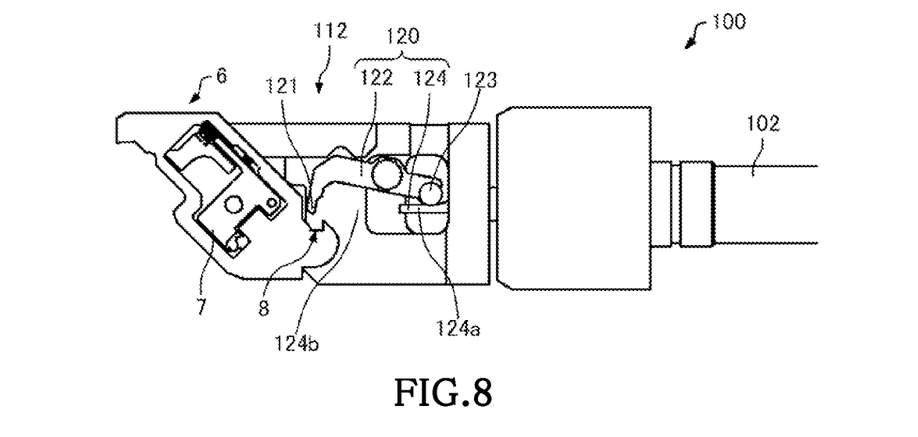

FIGS. 7 and 8 illustrate the function of the resilient member 140. FIG. 7 shows a state in which the cartridge 6 is secured to the mounting portion 112 by the chuck device 120. FIG. 8 shows a state in which the cartridge 6 is unlocked by the chuck device 120.

As shown in FIG. 7, the first portion 124a of the manipulative shaft 124 has a length of L1 along the central axis L and the second portion 124b has a length of L2 along the central axis L. The maximum amount of elastic deformation of the resilient member 140 along the central axis L is smaller than the length L1 of the first portion 124a and the length L2 of the second portion 124b.

Therefore, when the cartridge 6 is secured to the mounting portion 112 by the chuck device shown in FIG. 5, if the resilient member 140 elastically deforms, the condition where the cartridge 6 is locked by the chuck device 120 can be maintained as shown in FIG. 7. Similarly, when the cartridge 6 is unlocked by the chuck device 120 shown in FIG. 6, if the resilient member 140 elastically deforms, the condition where the cartridge 6 is unlocked by the chuck device 120 can be maintained as shown in FIG. 8.

2.2. Operation of Electron Microscope

2.2.1. Attachment of Cartridge

Figure 9:
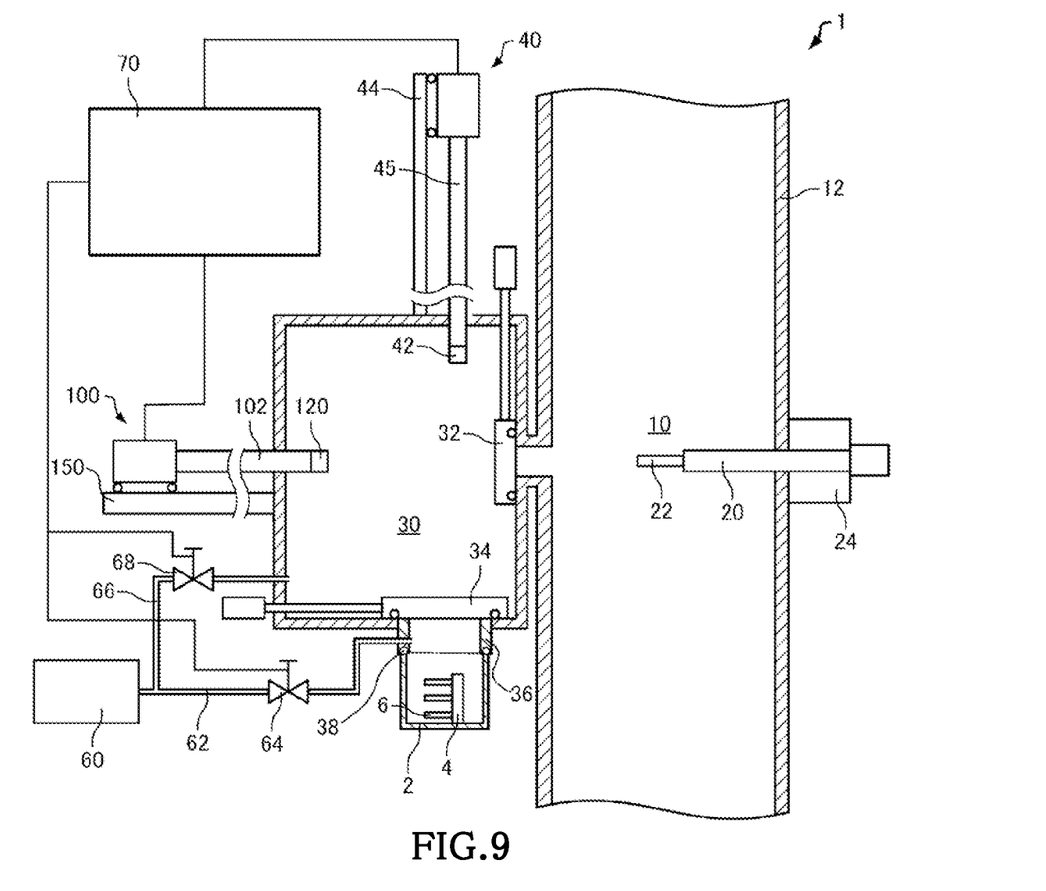
FIGS. 9-11 are views illustrating the operation of an electron microscope associated with one embodiment of the present invention.
Figure 10:
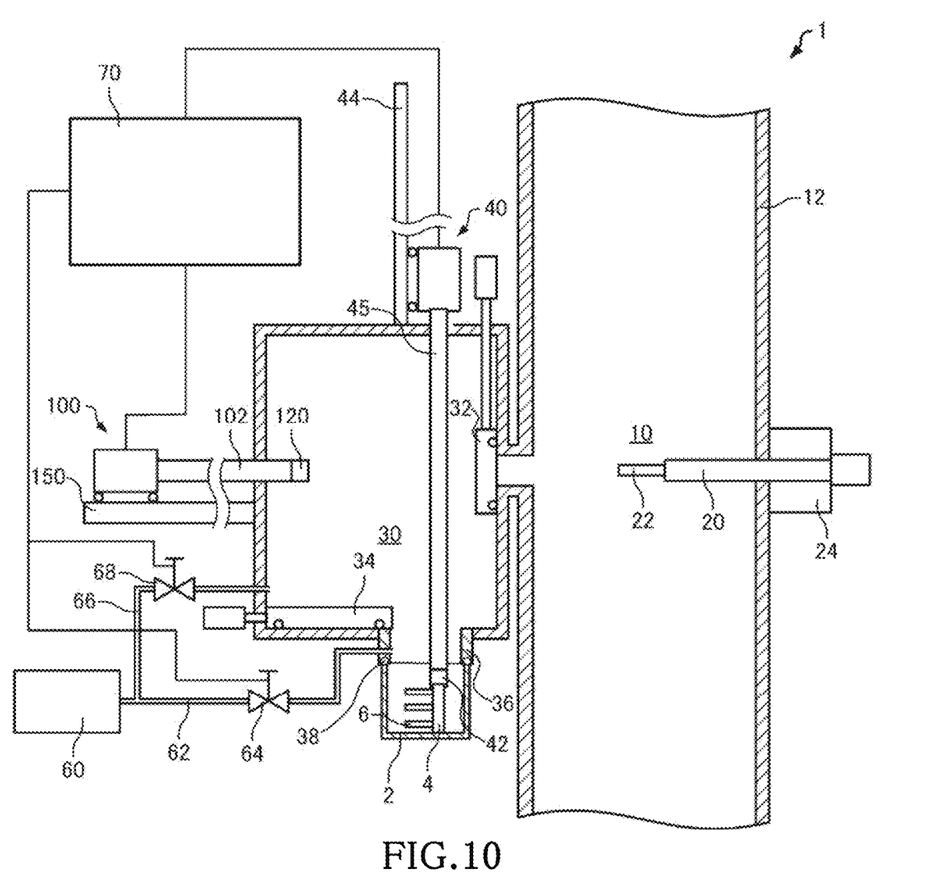
Figure 11:
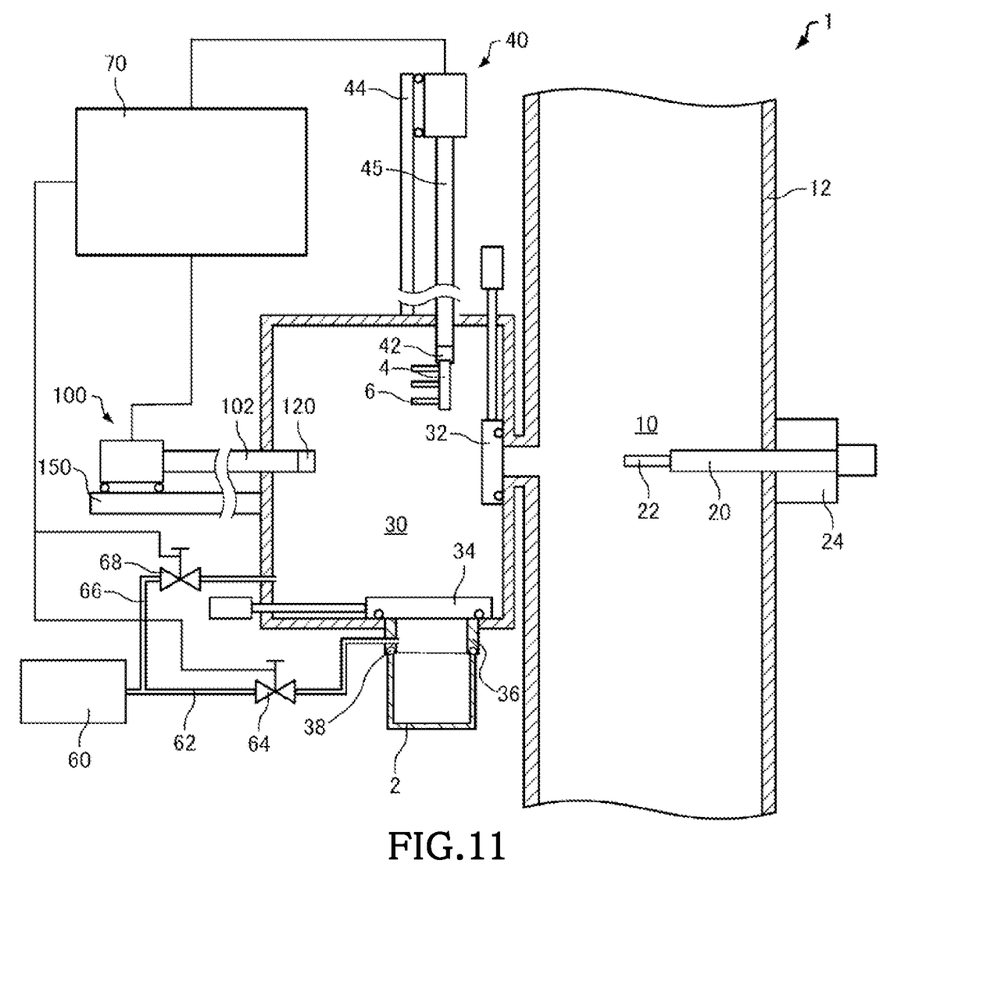

In the electron microscope 1, the cartridge 6 received in the sample container 2 can be automatically transported into the sample chamber 10 and attached to the mounting portion 112. FIGS. 9-11 illustrate the operation of the electron microscope 1.

As shown in FIG. 9, the cartridge 6 loaded in the magazine 4 is received in the sample container 2, which in turn is mounted to the connective member 36. At this time, the partition valve 34 is closed. The user enters an instruction to the controller 70 to introduce the cartridge 6.

Upon receiving the instruction for introducing the cartridge 6, the controller 70 opens the solenoid valve 64 and evacuates the interior of the sample container 2 to a vacuum. When the interior of the sample container 2 becomes below a given pressure, the controller 70 opens the partition valve 34.

As shown in FIG. 10, the first transport device 40 grips the magazine 4 in the sample container 2 and the magazine 4 is transported into the sample exchange chamber 30 under control of the controller 70. Then, as shown in FIG. 11, the partition valve 34 is closed while the partition valve 32 is opened also under control of the controller 70.

As shown again in FIG. 1, the second transport device 100 grips the specified cartridge 6 from within the magazine 4 gripped by the first transport device 40 and transports the gripped cartridge 6 into the sample chamber 10 under control of the controller 70. At this time, the cartridge 6 is locked by the chuck device 120. The cartridge 6 passes through the gap between the top and bottom polepieces on its way to the sample chamber 10.

As shown again in FIG. 2, the controller 70 causes the second transport device 100 to move the cartridge 6 in an oblique direction C and to deliver the cartridge 6 to the sample holder 20. In particular, after the second transport device 100 pushes the cartridge 6 into the mounting portion 22 of the sample holder 20, the chuck device 120 releases the securing of the cartridge 6. This permits the cartridge 6 to be delivered to the sample holder 20.

When the cartridge 6 is delivered to the sample holder 20, the cartridge 6 is pushed into the mounting portion 22 of the sample holder 20. Therefore, a force is applied to the sample holder 20 but elastic deformation of the resilient member 140 of the second transport device 100 can mitigate the force applied to the holder 20. Consequently, drifting of the sample on the sample holder 20 can be reduced. Furthermore, in the second transport device 100, if the resilient member 140 elastically deforms, the chuck device 120 can maintain the securing of the cartridge 6.

After delivering the cartridge 6 to the sample holder 20, the controller 70 returns the chuck device 120 into the sample exchange chamber 30 and closes the partition valve 32.

Because of the processing steps described so far, the cartridge 6 can be delivered to the sample holder 20. In consequence, the sample held in the cartridge 6 can be observed with the electron microscope 1.

2.2.2. Detachment of Cartridge

In the electron microscope 1, the cartridge 6 can be automatically taken out from the mounting portion 22 of the sample holder 20 and transported into the sample exchange chamber 30.

As shown in FIG. 1, the controller 70 opens the partition valve 32 and moves the chuck device 120 of the second transport device 100 into the sample chamber 10. The chuck device 120 is moved to the mounting portion 22 of the sample holder 20 and locks itself to the mounting portion 22 under control of the controller 70. The cartridge 6 is moved in a direction reverse to the oblique direction C by the drive mechanism 150 also under control of the controller 70. Consequently, the cartridge 6 is taken out from the mounting portion 22 of the sample holder 20.

The second transport device 100 transports the cartridge 6 into the sample exchange chamber 30 and then the partition valve 32 is closed under control of the controller 70. Then, as shown in FIG. 11, the second transport device 100 loads the cartridge 6 into the magazine 4 gripped by the first transport device 40 also under control of the controller 70. Because of the processing steps described so far, the cartridge 6 can be conveyed into the sample exchange chamber 30.

3. Functions and Effects

The second transport device 100 includes the mounting portion 112 to which the cartridge 6 can be detachably mounted, the shaft portion 102 providing support of the mounting portion 112, and the resilient member 140 connecting together the shaft portion 102 and the mounting portion 112. Therefore, in the second transport device 100, when the cartridge 6 is delivered to the sample holder 20, the force applied to the sample holder 20 can be reduced by resilient deformation of the resilient member 140. This results in less deformation of the sample holder 20, thus giving rise to less drifting of the sample.

The second transport device 100 includes: the shaft member 130 to which the mounting portion 112 is secured; and the bearing 132 for guiding rectilinear motion of the shaft member 130. The resilient member 140 is connected to the shaft member 130, while the bearing 132 is secured to the shaft portion 102. Therefore, in the second transport device 100, the shaft member 130 to which the mounting portion 112 is secured can be moved rectilinearly. Hence, the force applied to the shaft portion 102 can be reduced efficiently by the resilient member 140.

The second transport device 100 includes the chuck device 120 for locking the cartridge 6 to the mounting portion 112. The chuck device 120 includes: the lever 122 for securing the cartridge 6; and the manipulative shaft 124 connected to the lever 122. The manipulative shaft 124 moves along the central axis L of the shaft portion 102 to switch between a condition in which the lever 122 locks the cartridge 6 to the mounting portion 112 and a condition in which the lever 122 unlocks the cartridge 6. Therefore, in the second transport device 100, the cartridge 6 can be secured to the mounting portion 112.

In the second transport device 100, the lever 122 secures the cartridge 6 when the lever 122 is in contact with the first portion 124a of the manipulative shaft 124. The lever 122 releases the cartridge 6 when the lever 122 is in contact with the second portion 124b of the manipulative shaft 124. The length L1 of the first portion 124a along the central axis L and the length L2 of the second portion 124b along the central axis L are greater than the maximum amount of elastic deformation of the resilient member 140 along the central axis L. Therefore, when the chuck device 120 secures the cartridge 6 to the mounting portion 112, if the resilient member 140 elastically deforms, it is possible to maintain the condition where the chuck device 120 locks the cartridge 6. Similarly, when the chuck device 120 unlocks the cartridge 6, if the resilient member 140 elastically deforms, it is possible to maintain the condition where the chuck device 120 unlocks the cartridge 6.

4. Modified Embodiments

In the foregoing embodiment, the charged particle beam system associated with the present invention has been described in which an electron microscope for observing or analyzing a sample using an electron beam is taken as an example. The charged particle beam system associated with the present invention may also be an instrument for making an observation or analysis of a sample using a charged particle beam other than an electron beam such as an ion beam. For example, the charged particle beam system associated with the present invention may be a scanning transmission electron microscope, a scanning electron microscope, an Auger electron spectrometer, a focused ion beam system, or the like.

It is to be understood that the present invention is not restricted to the above embodiments and modifications and that the invention can be practiced in further modified forms. For example, the present invention embraces configurations substantially identical (e.g., in function, method and results or in purpose and advantageous effects) to the configurations described in the above embodiments. Furthermore, the present invention embraces configurations similar to the configurations described in the above embodiments except that nonessential portions have been replaced. In addition, the present invention embraces configurations identical in advantageous effects or purpose to the configurations described in the above embodiments. Further, the present invention embraces configurations similar to the configurations described in the above embodiments except that a well-known technique is added.

What is claimed is:

1. A transport device for delivering a cartridge to a sample holder in a charged particle beam system, said transport device comprising:
   a mounting portion to which the cartridge can be detachably mounted;
   a shaft portion providing support of the mounting portion, wherein the shaft portion comprises a front end;
   a shaft member to which said mounting portion is secured;
   a resilient member connecting together the shaft portion and the mounting portion, wherein the mounting portion is connected to the shaft portion via the shaft member and the resilient member, wherein the resilient member is elastically deformed in a direction parallel to a central axis of the shaft portion to reduce a force applied to the shaft portion;
   a chuck device for securing said cartridge to said mounting portion;
   wherein the chuck device is mounted to the front end of the shaft portion;
   wherein the chuck device comprises a lever for securing the cartridge and a manipulative shaft connected to the lever;
   wherein the manipulative shaft is connected to an air cylinder;
   wherein power from the air cylinder movably passes the manipulative shaft through the shaft member and the shaft portion along the central axis of said shaft portion and thereby is switched between a condition where the lever locks the cartridge to the mounting portion and a condition where the lever unlocks the cartridge from the mounting portion; and
   wherein power from the air cylinder moves the chuck device in a direction parallel to the central axis of the shaft portion by moving the shaft portion.

2. The transport device as set forth in claim 1, further comprising:
   a bearing secured to said shaft portion and operative to guide rectilinear motion of the shaft member to which said resilient member is connected.

3. The transport device as set forth in claim 1,
   wherein when the lever is in contact with a first portion of said manipulative shaft, the lever locks said cartridge to the mounting portion,
   wherein when the lever is in contact with a second portion of the manipulative shaft, the lever unlocks the cartridge from the mounting portion,
   wherein the first portion of the manipulative shaft has a first length along the central axis,
   wherein the second portion of the manipulative shaft has a second length along the central axis, and
   wherein a maximum amount of elastic deformation of said resilient member along the central axis is a length smaller than each of the length of the first portion and the length of the second portion.

4. A charged particle beam system comprising a transport device as set forth in claim 1.

5. The charged particle beam system as set forth in claim 4, further comprising:
   a sample chamber in which a sample holder is disposed; and
   a sample exchange chamber connected to the sample chamber;
   wherein said transport device transports said cartridge between the sample chamber and the sample exchange chamber.

* * * * *